United States Patent
Liaw (10) Patent No.: US 9,728,691 B2
(45) Date of Patent: Aug. 8, 2017

(54) LIGHT-EMITTING DIODE STRUCTURE

(71) Applicant: BRIGHT LED ELECTRONICS CORP., New Taipei (TW)

(72) Inventor: Tsung-Jen Liaw, New Taipei (TW)

(73) Assignee: Bright LED Electronics Corp., New Taipei (TW)

( * ) Notice: Subject to any disclaimer, the term of this patent is extended or adjusted under 35 U.S.C. 154(b) by 0 days.

(21) Appl. No.: 15/016,501

(22) Filed: Feb. 5, 2016

(65) Prior Publication Data
US 2017/0054063 A1    Feb. 23, 2017

(30) Foreign Application Priority Data
Aug. 19, 2015  (TW) .............................. 104127062 A (51) Int. Cl.
*H01L 33/50* (2010.01)
*H01L 33/58* (2010.01)

(52) U.S. Cl.
CPC .............. *H01L 33/58* (2013.01); *H01L 33/50* (2013.01); *H01L 33/501* (2013.01); *H01L 33/505* (2013.01); *H01L 33/507* (2013.01); *H01L 33/508* (2013.01); *H01L 33/502* (2013.01); *H01L 2933/0041* (2013.01)

(58) Field of Classification Search
None
See application file for complete search history.

(56) References Cited

U.S. PATENT DOCUMENTS

| | | |
|---|---|---|
| 2005/0077531 A1 | 4/2005 | Kim |
| 2007/0222365 A1 | 9/2007 | Tamamura |
| 2013/0234185 A1 | 9/2013 | Akselrod |
| 2015/0084084 A1* | 3/2015 | Chae ................ H01L 33/44 257/98 |
| 2016/0163936 A1* | 6/2016 | Lopez ............... H01L 33/54 257/98 |
| 2016/0190400 A1* | 6/2016 | Jung ................ H01L 33/486 362/97.1 |

FOREIGN PATENT DOCUMENTS

| | | |
|---|---|---|
| EP | 2437321 A2 | 4/2012 |
| JP | 3407608 B2 | 5/2003 |
| TW | 200838974 A | 10/2008 |
| TW | 201251134 A | 12/2012 |
| TW | 201409754 A | 3/2014 |
| TW | 201427103 A | 7/2014 |
| WO | 2014111822 A1 | 7/2014 |

* cited by examiner

*Primary Examiner* — Minh-Loan Tran
(74) *Attorney, Agent, or Firm* — Rosenberg, Klein & Lee (57) ABSTRACT

The present invention relates to a light-emitting diode (LED) structure, which comprises an LED unit. The LED unit is doped with a plurality of fluorescent powders in at least an arbitrary layer on one side of a light-emitting layer. Alternatively, the LED unit includes a plurality of fluorescent powder particles arranged on at least a light-emitting surface of the LED unit. No gel is adopted for disposing or packaging fluorescent powders. Thereby, gel yellowing caused by long-term high-temperature heating of the LED structure will not occur. The yellowing phenomenon will affect the light-emitting efficiency of LED and induce color deviation.

8 Claims, 13 Drawing Sheets

LIGHT-EMITTING DIODE STRUCTURE

FIELD OF THE INVENTION

The present invention relates generally to a light-emitting diode (LED) structure, and particularly to an LED structure without yellowing phenomenon.

BACKGROUND OF THE INVENTION

There are various applications of LEDs in modern life, including traffic lights, rear lights of motorcycles, streetlights, computer indicators, and car lamps. In addition to necessary fabrication processes for LED chips, packaging processes for LEDs are also required.

The package form of the LED according to the prior art, owing to their appearance, is called bullet type for 5 mm type. This is the most mature packaging technology. Besides, this packaging method is also regarded the most economical and convenient by the packaging industry.

The packaging function for LED is to provide the necessary supports for LED chips in electricity, photonics, and heat dissipation. For example, when semiconductor devices are exposed to the atmosphere for a long time, they will age by moisture or other chemicals in the environment and resulting in degeneracy in property. An effective method for isolating the atmosphere is to use high-transparency epoxy to envelope LEDs. In addition, by selecting appropriate substrates, LEDs can be mechanically protected and thus improving their reliability substantially.

Moreover, LED packages still need excellent heat dissipation and optical extraction efficiency. In particular, the heat dissipation problem is more important. If the heat cannot be dissipation timely, the heat accumulated in devices will affect the lifetime and reliability of the devices.

Currently, the length of a side of the chip adopted by the LED according to the prior art is approximately 0.3 mm or smaller. Silver paste is used for attaching the chip on the reflector cup of the lead frame. The reflector cup is used for collecting the light emitted from the sidewall and reflecting the light to the desired direction. Next, a gold wire is used for connecting the positive terminal of the chip with a lead wire. The negative terminal is the reflector cup, which is connected with another lead wire. Then, high-temperature solidified epoxy is used for covering the top. While using the LED, a 20 mA current is used for driving. Around 90% of heat must be conducted from the negative terminal to the lead wire via the reflector cup and entering the PCB. Nonetheless, because the heat conductivity of the lead frame is inferior, having a high value of thermal resistivity of 250-300° C./W, the heat dissipation for the LED is inferior and hence leading to increase in temperature. The high temperature affects the packaging materials for the LED, including the epoxy. The epoxy starts yellowing, which, in turn, affects the light emitting efficient of the LED. In addition, color deviation also occurs and the lifetime of the LED.

Accordingly, the present invention improves the drawbacks of the prior art and provides an LED structure. The LED structure improves solves the yellowing problem in the packaging gel for LED chips as a result of the high temperature generated by the LED chips. Fluorescent powders are not packaged using the package gel. Instead, they are disposed on the LED chips.

SUMMARY

An objective of the present invention is to provide an LED structure. By doping fluorescent powders, it is no more necessary to package LED chips using package gel mixed with fluorescent powders. Thereby, high-temperature influence by LED, which leads to yellowing of the package gel and affecting the light-emitting efficiency of LED, on the package gel can be avoided.

Another objective of the present invention is to provide an LED structure. By arranging fluorescent powders on the light-emitting surface of the LED, it is no more necessary to package LED chips using package gel mixed with fluorescent powders. Thereby, high-temperature influence by LED, which leads to yellowing of the package gel and affecting the light-emitting efficiency of LED, on the package gel can be avoided.

In order to achieve the objectives and efficacies as described above, the present invention provides an LED structure, which comprises an LED unit doped with a plurality of fluorescent powders in at least an arbitrary layer on one side of a light-emitting layer.

The present invention provides another LED structure, which comprises an LED unit with a plurality of fluorescent powders arranged on at least a light-emitting surface of the LED unit.

DETAILED DESCRIPTION

In order to make the structure and characteristics as well as the effectiveness of the present invention to be further understood and recognized, the detailed description of the present invention is provided as follows along with embodiments and accompanying figures.

Presently, LED packages need excellent heat dissipation and optical extraction efficiency. In particular, the heat dissipation problem is more important. If the heat cannot be dissipation timely, the heat accumulated in devices will affect the lifetime and reliability of the devices. Particularly, the package gel for LED chips will be affected. The normal temperature of usage of epoxy s −50 to 150° C. The high temperature affects the packaging materials for the LED, namely, the epoxy. The epoxy starts yellowing, which, in turn, affects the light emitting efficient of the LED. In addition, color deviation also occurs and the lifetime of the LED.

Figure 1:
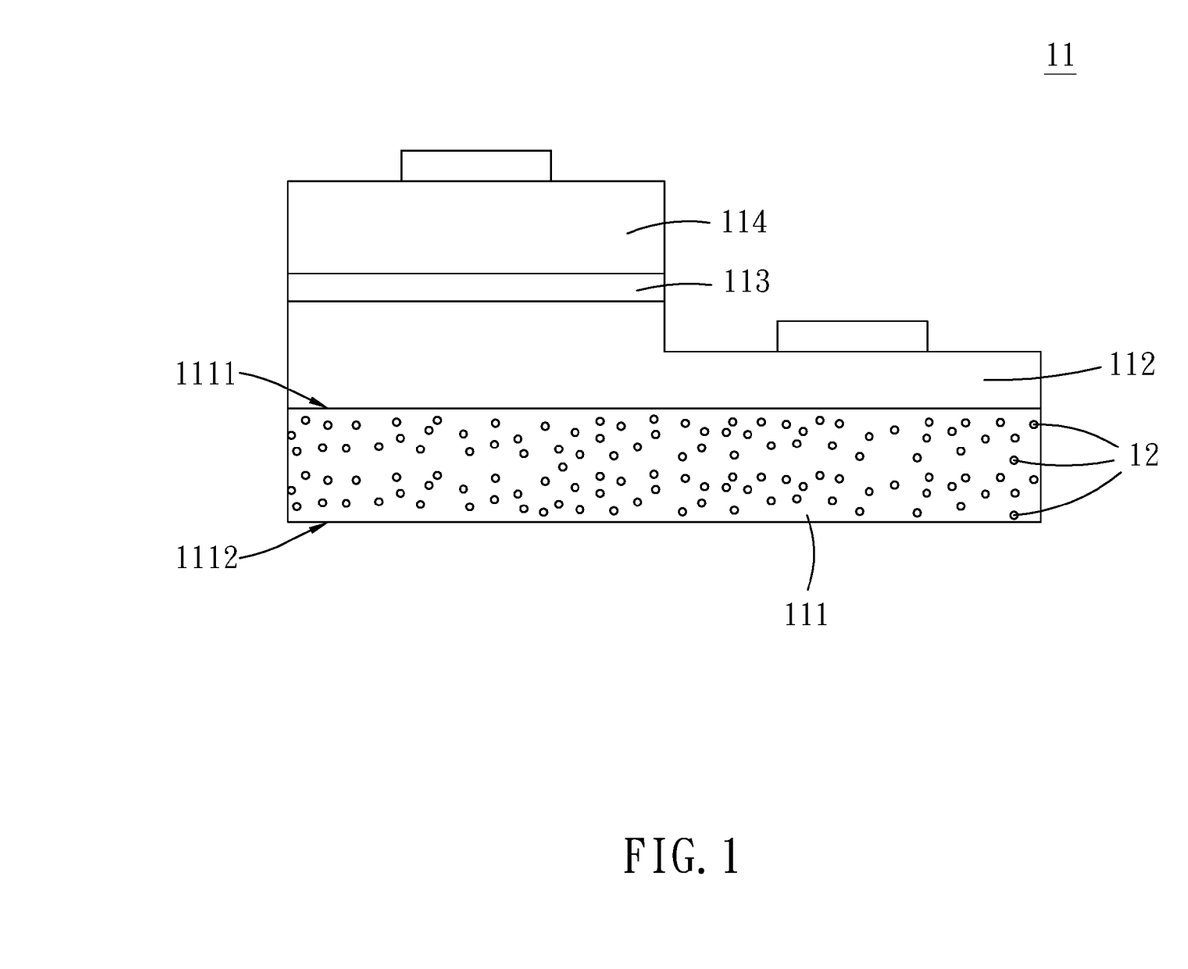
FIG. 1 shows a schematic diagram of the LED structure according to the first embodiment of the present invention.

Please refer to FIG. 1, which shows a schematic diagram of the LED structure according to the first embodiment of the present invention. As shown in the figure, the present embodiment discloses an LED structure, which comprises an LED unit 11. The LED unit 11 is doped with a plurality of fluorescent powders 12 in at least a layer on one side of a light-emitting layer of the LED unit 11. According to the present embodiment, a first substrate 111 of the LED unit 11 is taken as the layer for example. In addition, a person having ordinary skill in the art should know the doping technique to the arbitrary layer.

The first substrate 111 of the LED unit 11 includes a first side surface 1111 and a second side surface 1112 opposing to the first side surface 1111. An N-type semiconductor layer 112 is disposed on the first side surface 1111 of the first substrate 111. A light-emitting layer 113 is disposed on the side of the N-type semiconductor layer 12 not adjacent to the first substrate 111. A P-type semiconductor layer 114 is disposed on the side of the light-emitting layer 113 not adjacent to the N-type semiconductor layer 112.

According to the present embodiment, the material of the first substrate 111 can be sapphire, glass, or ceramics. According to the present embodiment, a sapphire substrate is adopted. Sapphire (Al$_2$O$_3$) is the major substrate material for fabricating gallium nitride (GaN) epitaxial light-emitting layer. It can be used for manufacturing super-high-brightness blue, green, blue-green, and white LEDs. The composition of sapphire is aluminum oxide, which is formed by three oxygen atoms and two aluminum atoms in covalent bonds. The crystal structure is hexagonal. The optical transparency range is sapphire is wide, ranging from near-ultraviolet to mid-infrared. Currently, the domestic growth methods for sapphire crystals include Czochralski (CZ) and Kyropoulos (KY) methods. By using the fabrication process of doping the plurality of fluorescent powders 12 to the sapphire substrates, the fabricated sapphire substrates will include the plurality of fluorescent powders 12. Thereby, it is not necessary to use gel for mixing the plurality of fluorescent powders 12 before packaging the LED structure. Besides, the same method can be applied to transparent substrates made of glass and ceramic materials. Furthermore, the color of the plurality of fluorescent powders 12 according to the present embodiment can be selected according users' requirements.

According to the present embodiment, the LED structure according to the prior art is improved. In general, in order to adjust the light emitted by an LED structure, when packaging LED dies, fluorescent powders are first mixed in the package gel before the LED chips are packaged. Then the light of the LED chips will change its color after passing through the fluorescent powders in the package gel. Nonetheless, the materials of current package gel are mostly epoxy and silicone. These two materials cannot withstand high temperature for a long time. When an LED emits light, the long-term high temperature will cause epoxy to yellow, which, in turn, affects the light-emitting performance of the LED structure and induces color deviation. Thereby, the present invention provides an LED structure. In the process of fabricating the first substrate 111, the plurality of fluorescent powders 12 are doped into the first substrate 111 for replacing the method of disposing the plurality of fluorescent powders 12 in the gel. Because no gel is used for disposed LED chips, the LED structure will not yellow due to long-term high temperature. Consequently, the light-emitting performance will not be affected and no color deviation will occur.

Figure 2:
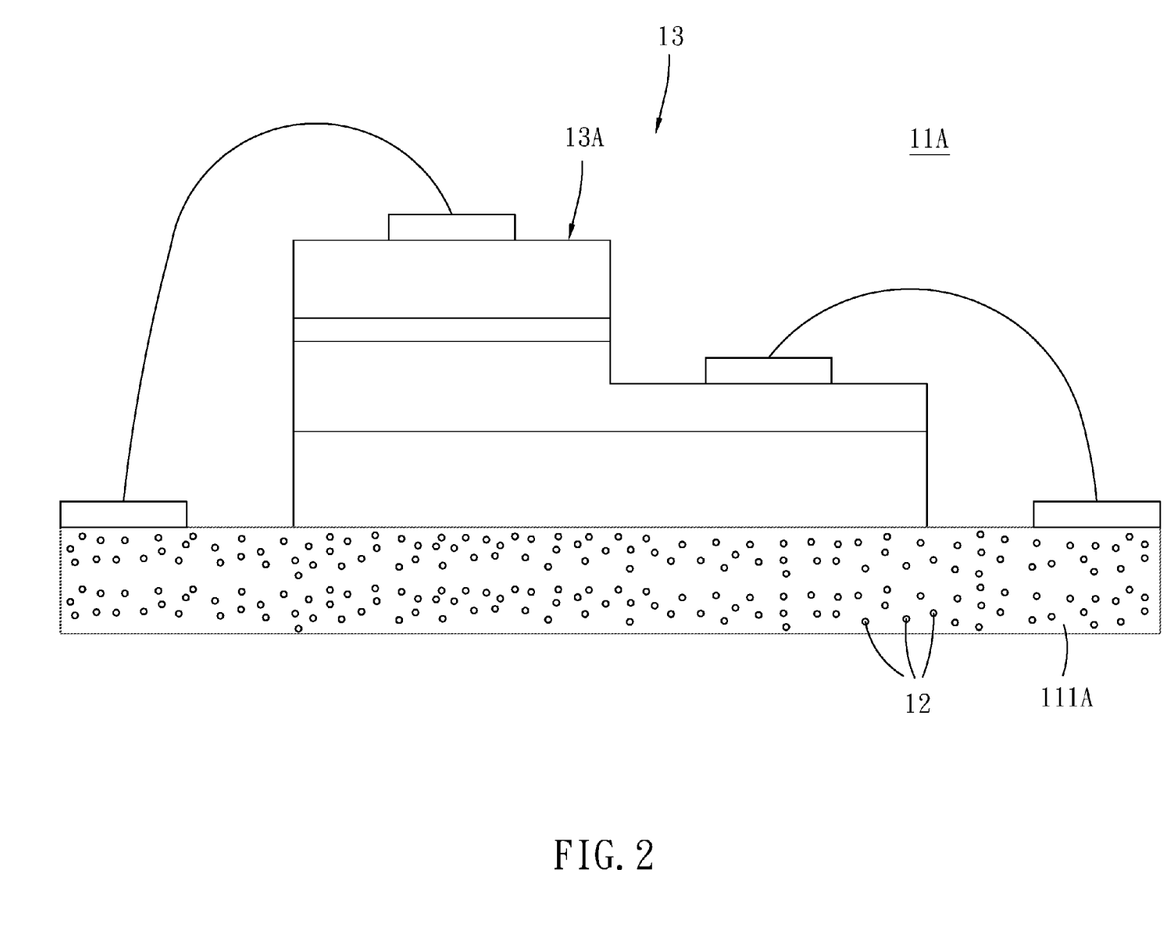
FIG. 2 shows a schematic diagram of the LED structure according to the second embodiment of the present invention.
Figure 3:
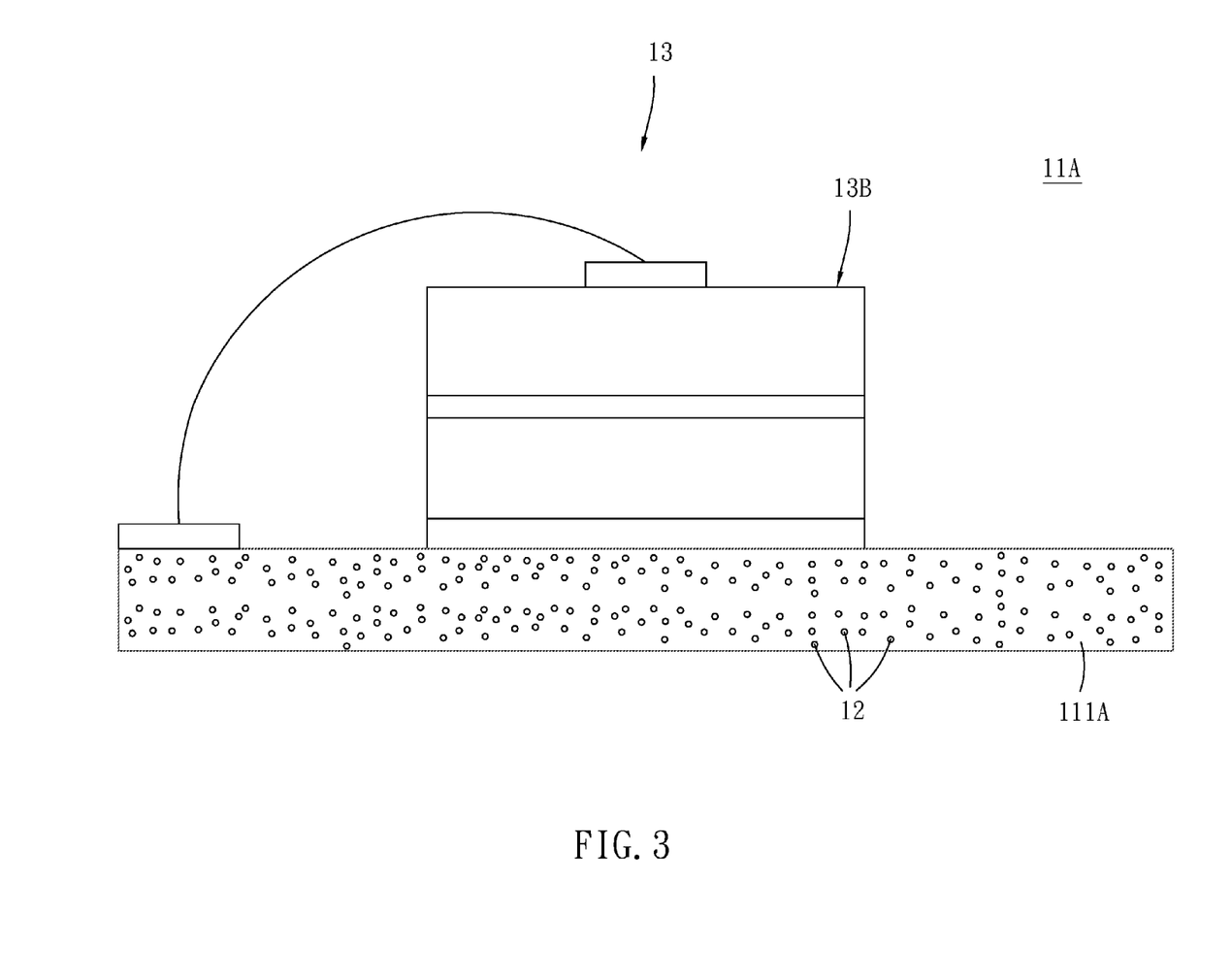
FIG. 3 shows a schematic diagram of the LED structure according to the third embodiment of the present invention.
Figure 4:
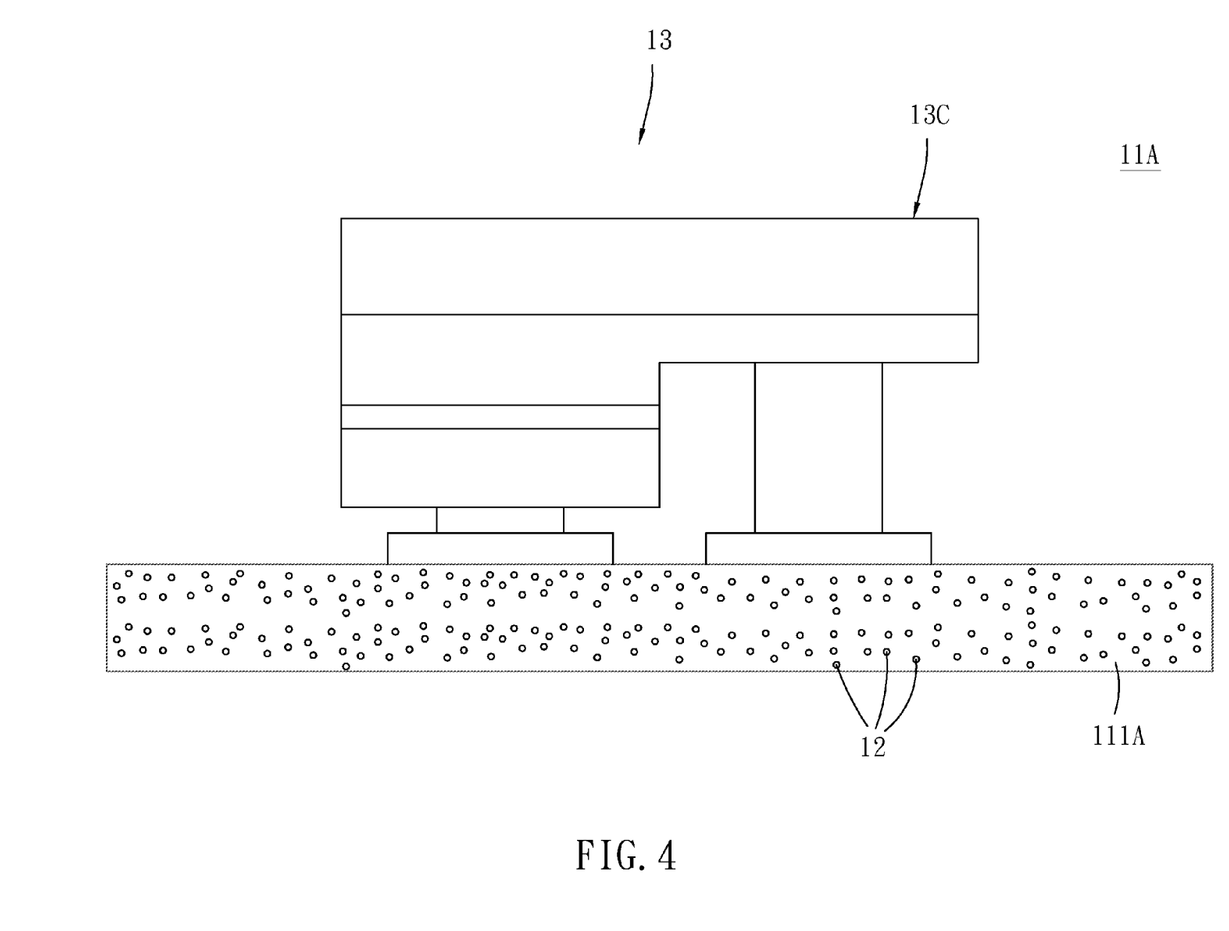
FIG. 4 shows a schematic diagram of the LED structure according to the fourth embodiment of the present invention.

Please refer to FIGS. 2 to 4, which show schematic diagram of the LED structure according to the second to the fourth embodiments of the present invention. As shown in the figures, the difference between the second to the fourth embodiment and the first one is that, an LED unit 11A of the LED structure according to the second to the fourth embodiments is in the state after a die is processed. According to the present embodiments, the processing method for the LED unit 11A is the chip on board (COB) packaging method, in which bare dies are attached directly to a printed-circuit board (PCB) and wires are bonded to the gold-plated circuitry of the PCB. Nonetheless, according to the present embodiments, chip packaging is not done by package gel. Besides, according to the present embodiment, the methods for processing dies are not limited to surface mount device (SMD) or COB. Both of these two methods omit the step of fixing dies using package gel. The LED unit 11A of the LED structure further comprises an LED chip 13 disposed on a second substrate 111A.

Please refer again to FIG. 2. According to the second embodiment, the LED chip 13 is a horizontal LED chip 13A and disposed on the second substrate 111A in the COB form. Please refer again to FIG. 3. The difference between the third embodiment and the second one is that, according to the third embodiment, the LED chip 13 is a vertical LED chip 13B. Moreover, please refer to FIG. 4. The difference between the fourth embodiment and the second one is that, according to the fourth embodiment, the LED chip 13 is a vertical LED chip 13C. Here, embodiments with various forms are provided.

Figure 5:
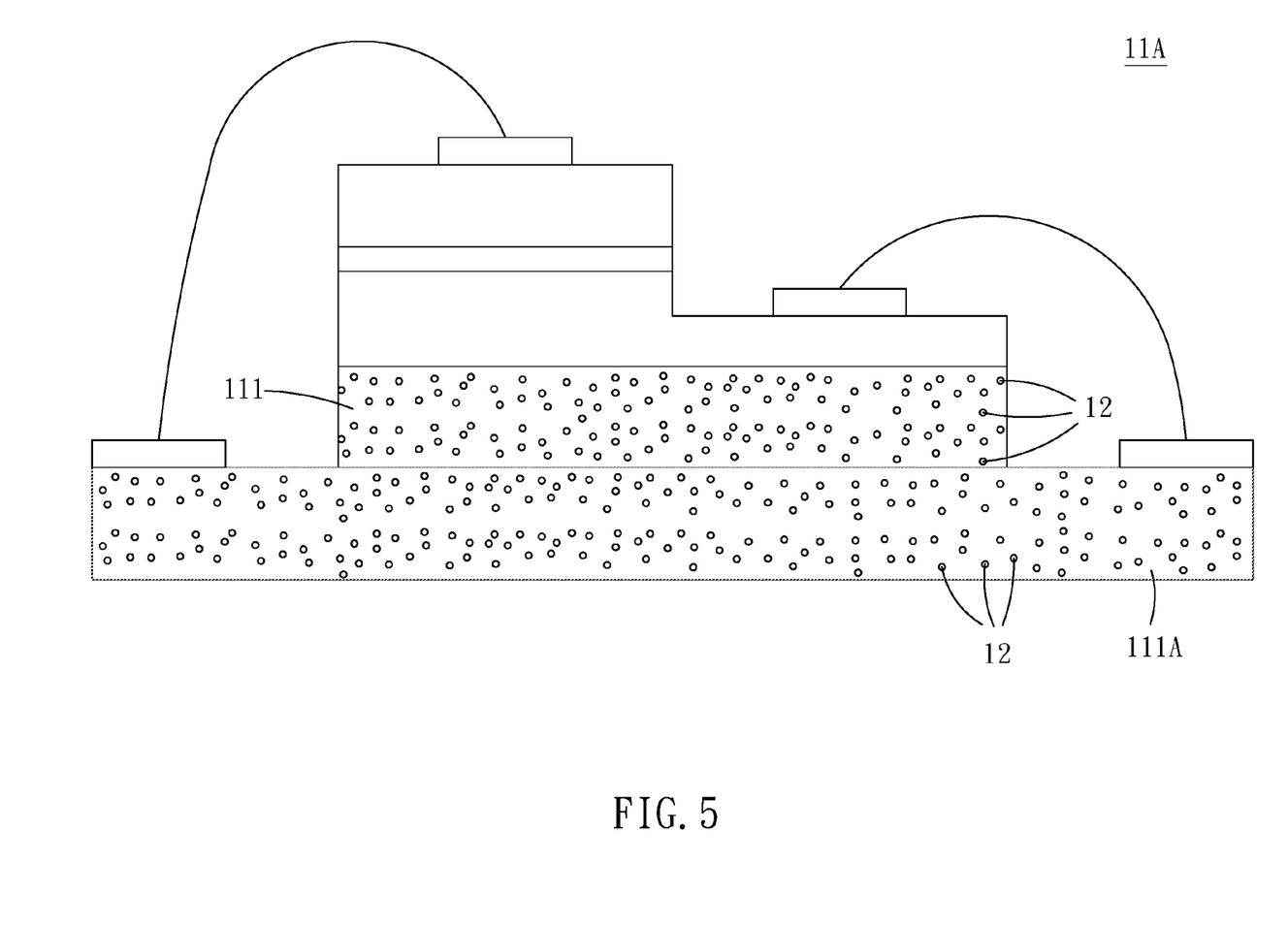
FIG. 5 shows a schematic diagram of the LED structure according to the fifth embodiment of the present invention.
Figure 6:
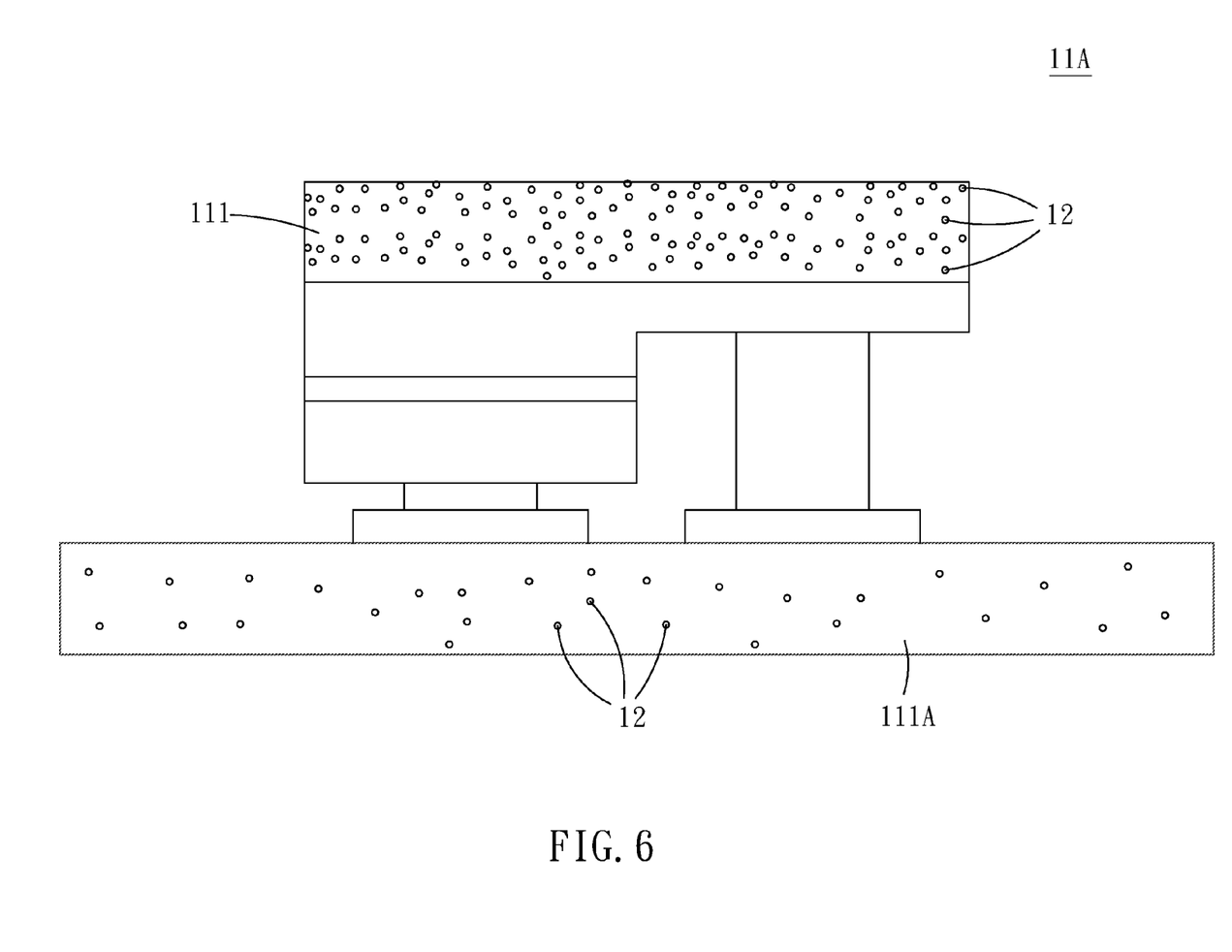
FIG. 6 shows a schematic diagram of the LED structure according to the sixth embodiment of the present invention.

Please refer to FIG. 5 and FIG. 6, which show schematic diagram of the LED structure according to the fifth and the sixth embodiments of the present invention. As shown in the figures, the difference between the fifth to the sixth embodiments with the first one is that, according to the fifth to the sixth embodiments, after the first substrate 111 is doped with the plurality of fluorescent powders 12 before processing the dies, the dies are then processed to be fixed on the second substrate 111A, which acts as the package substrate. In addition, the second substrate 111A is doped with the plurality of fluorescent powders 12.

Please refer again to FIG. 5. According to the fifth embodiment, the first substrate 111 for the horizontal LED chip 13A is doped with the plurality of fluorescent powders 12. In addition, the first substrate 111 is disposed on the second substrate 111A, namely, the package substrate. Likewise, the second substrate 111A is also doped with the plurality of fluorescent powders 12 and used for the LED unit 11 having a unidirectional light-emitting surface. Besides, please refer again to FIG. 6. The difference between the sixth embodiment and the fifth one is that, according to the sixth embodiment, the first substrate 111 for the flip-chip LED chip 13C is doped with the plurality of fluorescent powders 12. Likewise, the second substrate 111A is also doped with the plurality of fluorescent powders 12. One side of the P-type semiconductor layer 114 of the LED unit 11 is disposed on one side of the second substrate 11A. By using this method, the first and the second substrates 111, 111A are located on both sides of the LED unit 11, respectively. The light-emitting surfaces of the LED unit 11 includes up and down directions. Furthermore, the two light-emitting surfaces of the LED unit 11A may have different light intensity due to direct or reflective light emission. Thereby, the amount of the plurality of fluorescent powders 12 on the surface of the LED unit 11A having greater light emission is larger than that on the surface of the LED unit 11A having lesser light emission. The doping ratio of the fluorescent powders in two different layers on one side of the light-emitting layers can be adjusted according to practical needs.

Figure 7:
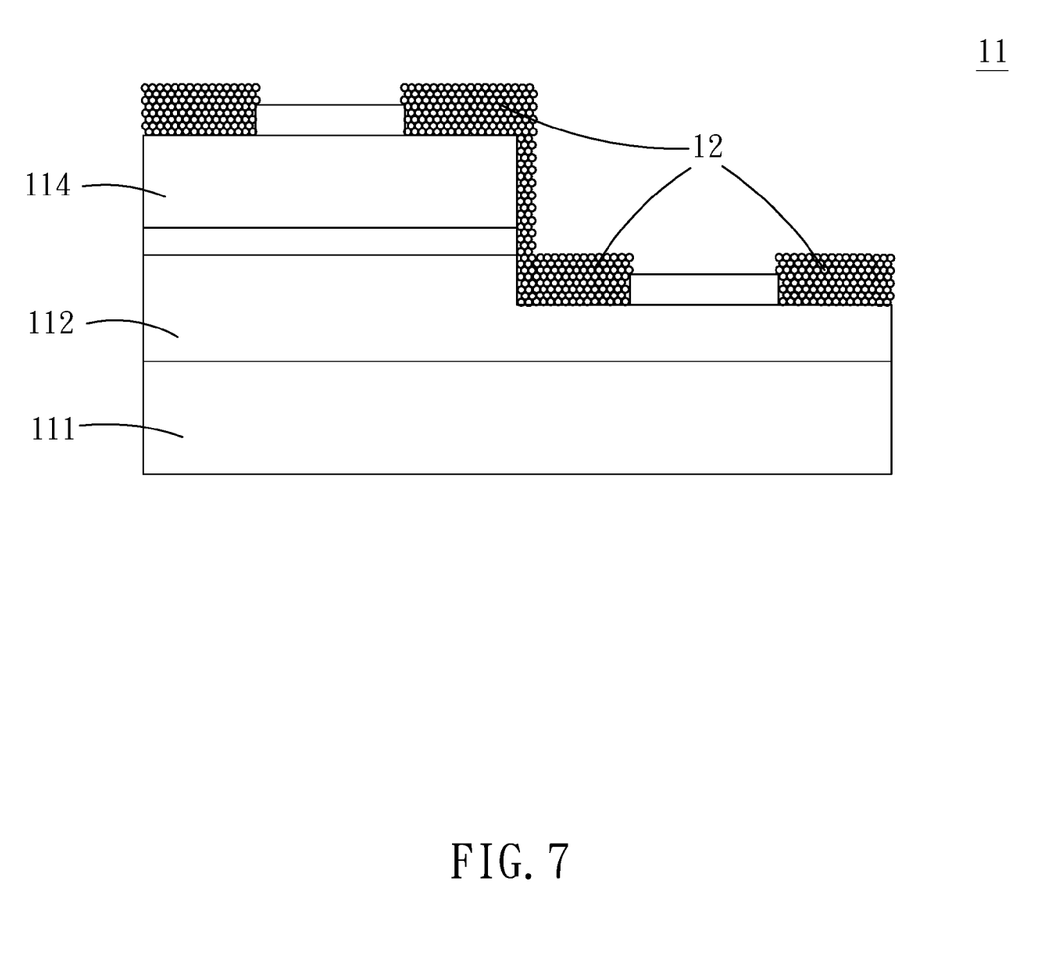
FIG. 7 shows a schematic diagram of the LED structure according to the seventh embodiment of the present invention.
Figure 8:
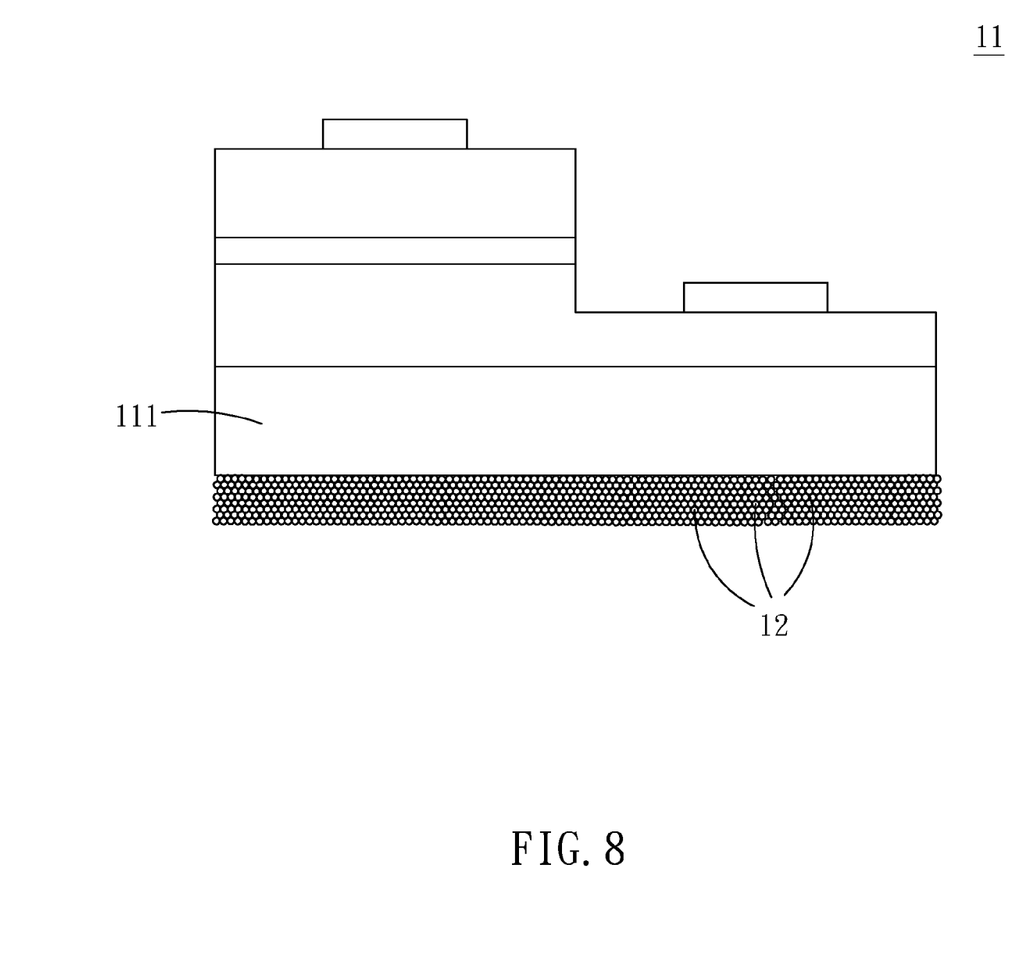
FIG. 8 shows a schematic diagram of the LED structure according to the eighth embodiment of the present invention.

Please refer to FIGS. 7 and 8, which show schematic diagrams of the LED structure according to the seventh and the eighth embodiments of the present invention. As shown in the figures, the seventh and the eighth embodiments provide an LED structure, which comprises an LED unit 11. The LED unit 11 is the unprocessed die cut from a wafer. A plurality of fluorescent powders 12 are arranged on the light-emitting surface of the LED unit 11. There are many methods for arranging the plurality of fluorescent powders 12 on the light-emitting surface of the LED unit 11 directly. The arrangement methods include vapor deposition, sputtering, or ion implantation. Gel is not adopted for coving the plurality of fluorescent powders 12 on the light-emitting surface of the LED unit 12. Nonetheless, the present embodiment is not limited to these arrangement methods. The arrangement methods are well described in the prior art. Hence, the details will not be described again.

FIG. 7 illustrates that the light-emitting surfaces of the LED unit 11 according to the seventh embodiment are the surfaces of the N-type and P-type semiconductors 112, 114. FIG. 8 illustrates that the light-emitting surface of the LED unit 11 according to the eighth embodiment is the surface of the first substrate 111. In addition, the plurality of fluorescent powders 12 are arranged on the surface of the first substrate 111.

Figure 9:
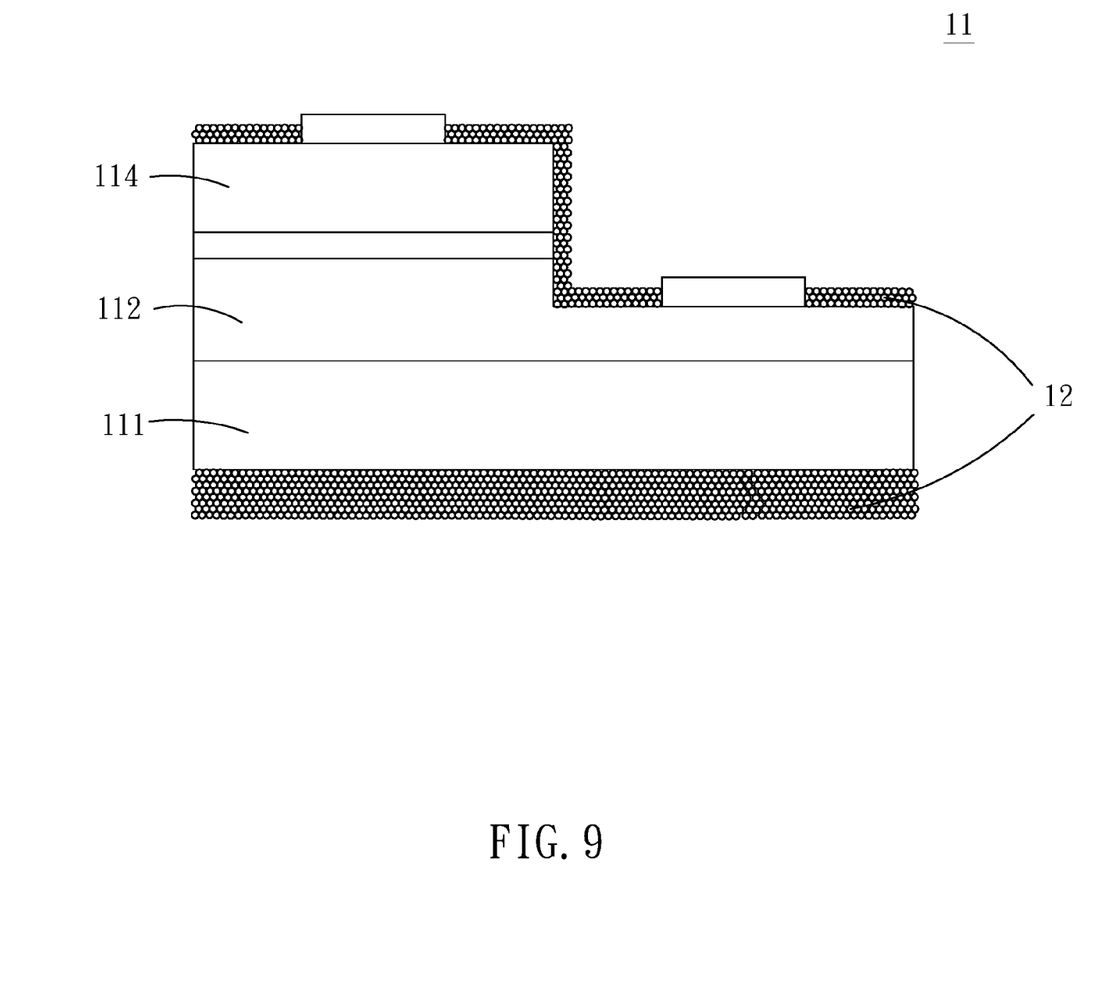
FIG. 9 shows a schematic diagram of the LED structure according to the ninth embodiment of the present invention.
Figure 10:
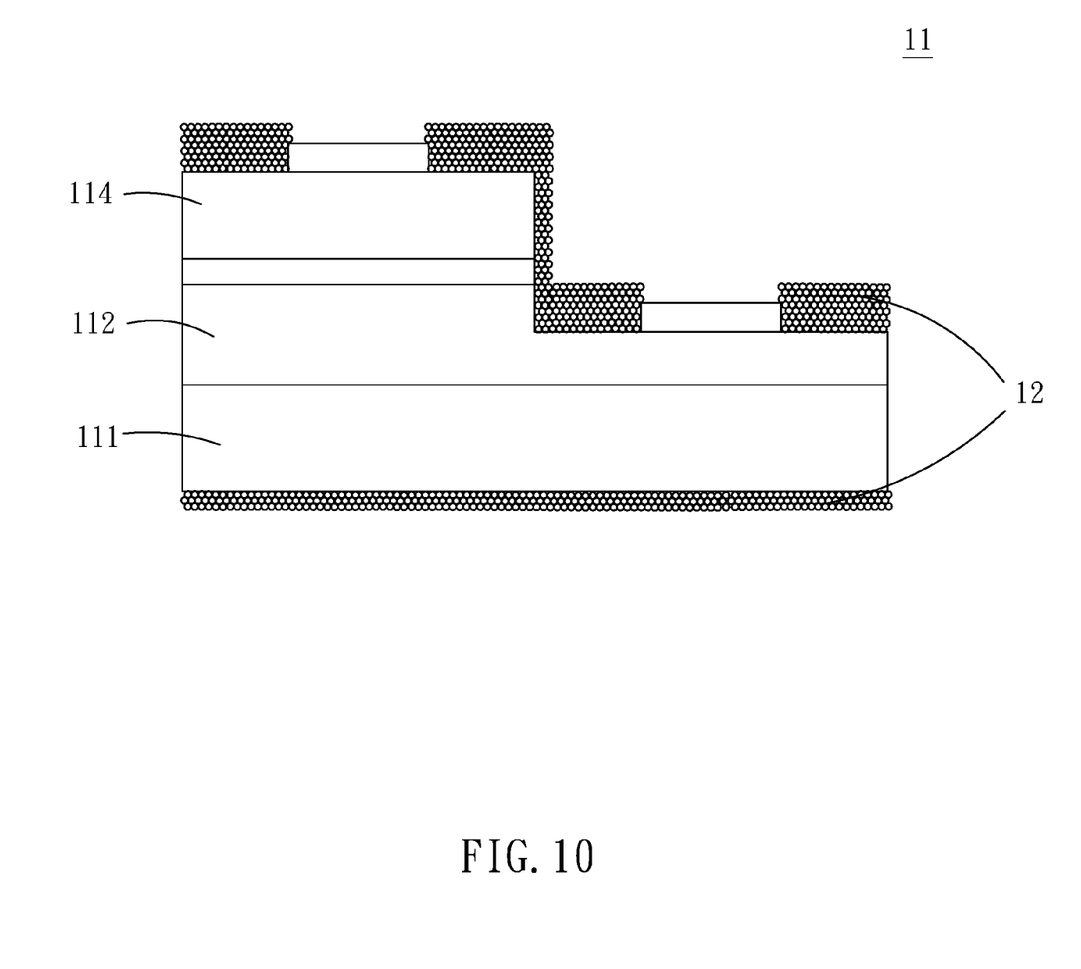
FIG. 10 shows a schematic diagram of the LED structure according to the tenth embodiment of the present invention.

Please refer to FIG. 9 and FIG. 10, which show schematic diagrams of the LED structure according the ninth and the tenth embodiments of the present invention. As shown in the figures, the difference between the ninth to the tenth embodiments and the seventh to the eighth embodiments is that the LED unit 11 according to the ninth to the tenth embodiments emits light from by surfaces. The light-emitting surfaces are the surfaces of the N- and P-type semiconductor layers 112, 114 and the surface of the first substrate 111, respectively. The plurality of fluorescent powders 12 are arranged on the surfaces of the N- and P-type semiconductor layers 112, 114 and the surface of the first substrate 111. The two light-emitting surfaces of the LED unit 11 may have different light intensity due to direct or reflective light emission. Thereby, the amount of the plurality of fluorescent powders 12 on the surface of the LED unit 11 having greater light emission is larger than that on the surface of the LED unit 11 having lesser light emission.

Figure 11:
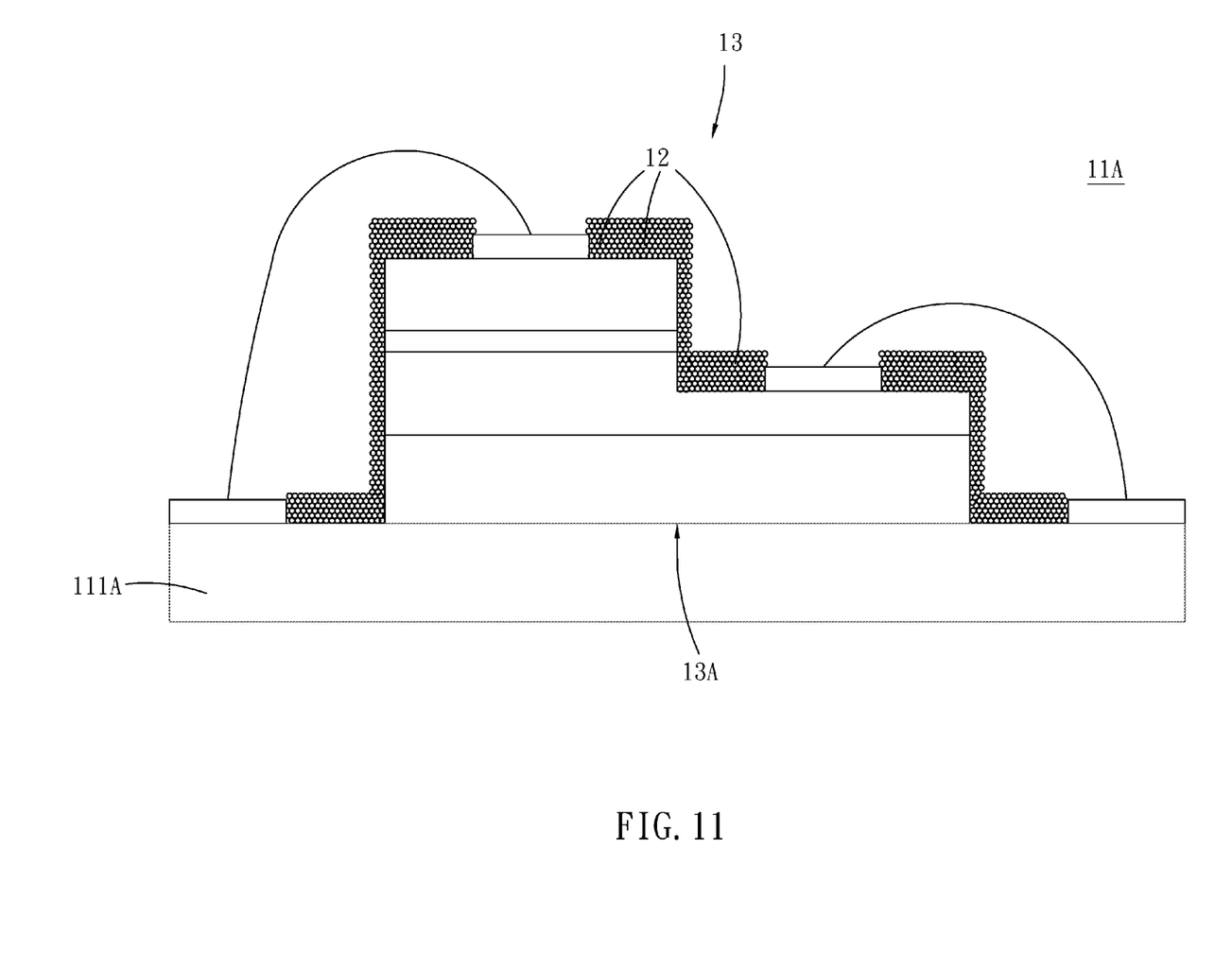
FIG. 11 shows a schematic diagram of the LED structure according to the eleventh embodiment of the present invention.
Figure 12:
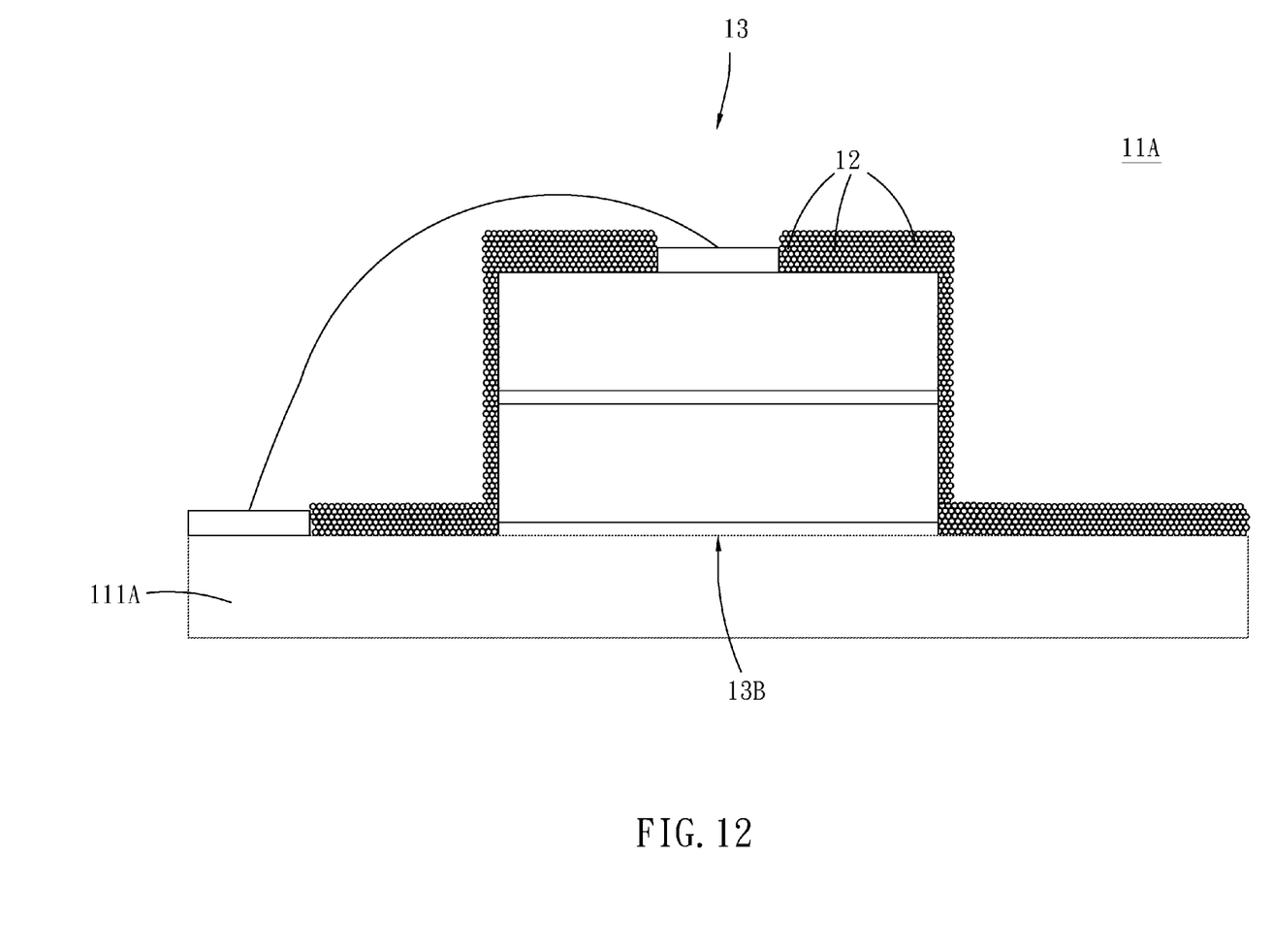
FIG. 12 shows a schematic diagram of the LED structure according to the twelfth embodiment of the present invention.
Figure 13:
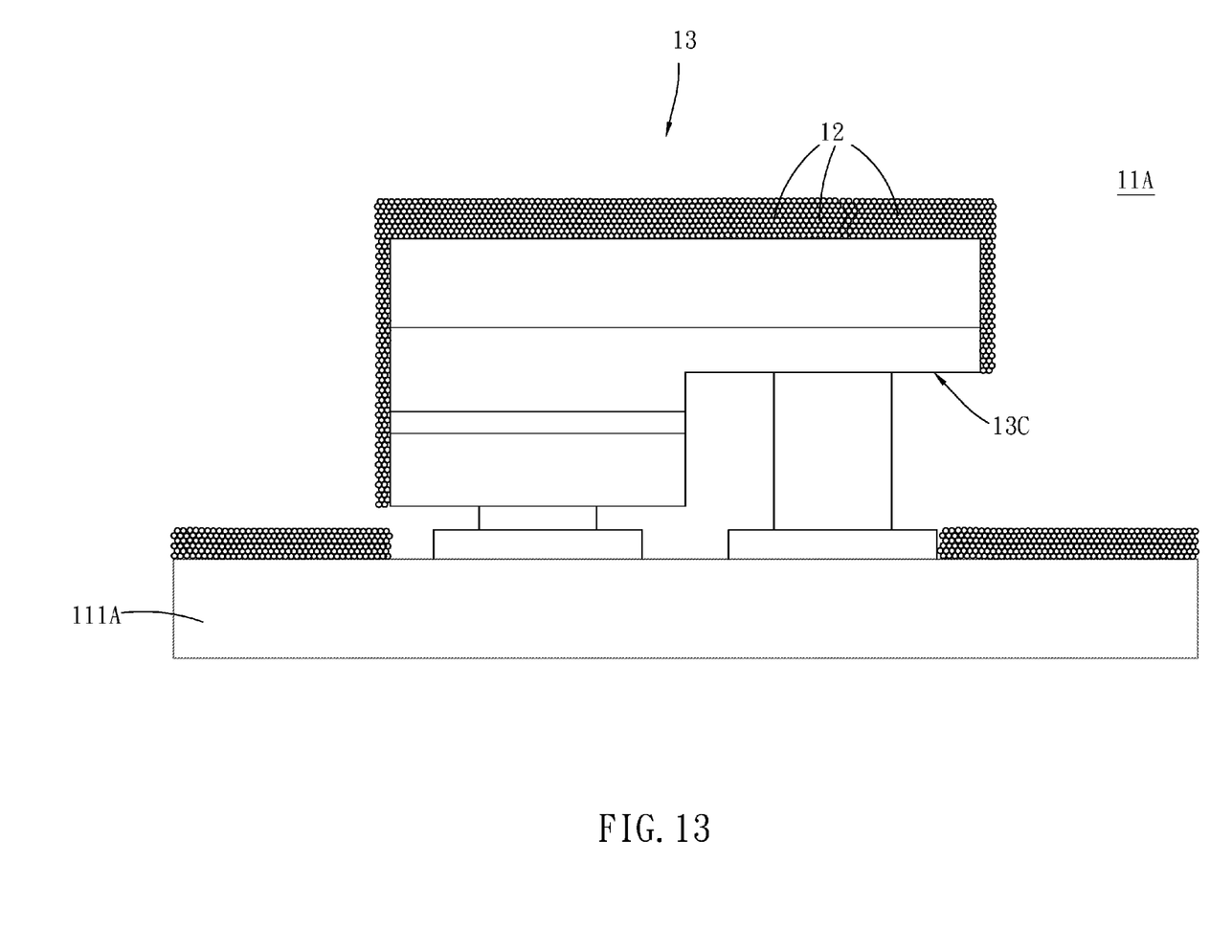
FIG. 13 shows a schematic diagram of the LED structure according to the thirteenth embodiment of the present invention.

Please refer to FIGS. 11 to 13, which show schematic diagrams of the LED structure according to the eleventh to the thirteenth embodiments of the present invention. As shown in the figures, the eleventh to the thirteenth embodiments provide an LED unit 11, which comprises an LED chip 13. The LED chip 13 is in the state after processing the dies. The LED chip 13 is disposed on the second substrate 111A. Then the plurality of fluorescent powders 12 are arranged on the light-emitting surfaces of the LED chip 13 and the second substrate 111A.

In FIG. 11, the eleventh embodiment illustrates that the LED chip 13 is a horizontal LED chip 13A. In addition, the plurality of fluorescent powders 12 are arranged on the light-emitting surfaces of the LED chip 13A and the second substrate 111A. Next, please refer to FIG. 12. The difference between the twelfth and the eleventh embodiments is that, according to the twelfth embodiment, the LED chip 13 is a vertical LED chip 13B. Furthermore, please refer to FIG. 13. The difference between the thirteenth embodiment and the eleventh one is that, according to the thirteenth embodiment, the LED chip 13 is a vertical LED chip 13C. Here, various embodiments are provided.

To sum up, the present invention relates to an LED structure, which comprises an LED unit. The LED unit is doped with a plurality of fluorescent powders in at least an arbitrary layer on one side of a light-emitting layer. Alternatively, the LED unit includes a plurality of fluorescent powder particles arranged on at least a light-emitting surface of the LED unit. No gel is adopted for disposing or packaging fluorescent powders. Thereby, gel yellowing caused by long-term high-temperature heating of the LED structure will not occur. The yellowing phenomenon will affect the light-emitting efficiency of LED. In addition, the present invention is not limited to horizontal LED, vertical LED, or flip-chip LED. It is not limited to COB or SMD package forms either. Hence, the technical features of the present invention can be applied.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A light-emitting diode structure, comprising a light-emitting diode unit, doped with a plurality of fluorescent powders in at least an arbitrary layer on one side of a light-emitting layer;
   wherein when said at least an arbitrary layer includes two or more layers, the ratio of doping said plurality of fluorescent powders differs.

2. The light-emitting diode structure of claim 1, wherein said light-emitting unit from bottom up comprising a first substrate, an N-type semiconductor layer, said light-emitting layer, and a P-type semiconductor layer; and said arbitrary layer includes said first substrate, said N-type semiconductor layer and said P-type semiconductor layer.

3. The light-emitting diode structure of claim 1, wherein said light-emitting diode chip is disposed upside down on and connected electrically to a second substrate.

4. The light-emitting diode structure of claim 3, wherein said arbitrary layer is said second substrate.

5. A light-emitting diode structure, comprising a light-emitting diode unit, including a plurality of fluorescent powder particles arranged on at least a light-emitting surface of said LED unit;
   wherein when said at least an arbitrary layer includes two or more layers, the ratio of doping said plurality of fluorescent powders differs.

6. The light-emitting diode structure of claim 5, wherein the light-emitting surface of said light-emitting unit includes the surfaces of an N-type semiconductor layer and a P-type semiconductor layer, the surface of a first substrate, or the surfaces of said N-type semiconductor layer, said P-type semiconductor layer, and said first substrate.

7. The light-emitting diode structure of claim 6, wherein said plurality of fluorescent powders are arranged on the surfaces of said N-type semiconductor layer, said P-type semiconductor layer, and said first substrate; the amount of said plurality of fluorescent powders on a surface of said light-emitting diode unit having greater light emission is larger than the amount of said plurality of fluorescent powders on a surface of the LED having lesser light emission.

8. The light-emitting diode structure of claim 5, wherein the methods for arranging said plurality of fluorescent powders on the light-emitting surface of said LED unit include vapor deposition, sputtering, or ion implantation.

* * * * *